United States Patent
Torfs et al.

(10) Patent No.: US 12,249,970 B2
(45) Date of Patent: Mar. 11, 2025

(54) CASCADABLE FILTER ARCHITECTURE

(71) Applicants: UNIVERSITEIT GENT, Ghent (BE); IMEC VZW, Leuven (BE)

(72) Inventors: Guy Torfs, De Pinte (BE); Michiel Verplaetse, Nazareth (BE)

(73) Assignees: UNIVERSITEIT GENT, Ghent (BE); IMEC VZW, Leuven (BE)

( * ) Notice: Subject to any disclaimer, the term of this patent is extended or adjusted under 35 U.S.C. 154(b) by 1022 days.

(21) Appl. No.: 17/280,105

(22) PCT Filed: Sep. 24, 2019

(86) PCT No.: PCT/EP2019/075773
§ 371 (c)(1),
(2) Date: Mar. 25, 2021

(87) PCT Pub. No.: WO2020/064780
PCT Pub. Date: Apr. 2, 2020

(65) Prior Publication Data
US 2022/0006446 A1 Jan. 6, 2022

(30) Foreign Application Priority Data

Sep. 27, 2018 (EP) .................................. 18197342

(51) Int. Cl.
*H03H 17/02* (2006.01)
*H03H 15/02* (2006.01)
*H03H 17/06* (2006.01)

(52) U.S. Cl.
CPC ........ *H03H 17/0286* (2013.01); *H03H 15/02* (2013.01); *H03H 17/06* (2013.01); *H03H 2017/0298* (2013.01); *H03H 2218/04* (2013.01)

(58) Field of Classification Search
CPC .... H03H 17/0286; H03H 15/02; H03H 17/06; H03H 2017/0298; H03H 17/0009;
(Continued)

(56) References Cited

U.S. PATENT DOCUMENTS 5,392,230 A * 2/1995 Christopher ......... H04N 21/426
708/319
6,442,581 B1 8/2002 Laroche
(Continued)

FOREIGN PATENT DOCUMENTS

CA 2178664 A1 12/1997
CN 101233686 A 7/2008
(Continued)

OTHER PUBLICATIONS

C. W. Farrow, "A continuously variable digital delay element," 1988., IEEE International Symposium on Circuits and Systems, Espoo, Finland, 1988, pp. 2641-2645 vol.3, doi: 10.1109/ISCAS.1988.15483. (Year: 1988).*
(Continued)

*Primary Examiner* — Emily E Larocque
(74) *Attorney, Agent, or Firm* — Workman Nydegger

(57) ABSTRACT

A filter includes cascaded building blocks, for filtering an incoming signal. Each building block has first and second delay elements. A first scaling device is between an input node of the first delay element and an output node of the second delay element, and a second scaling device is between an output node of the first delay element and an input node of the second delay element. The building block has a cross scaling device between the output nodes of the first delay element and of the second delay element, and/or between the input nodes of the first delay element and of the second delay element. The building block is configured such that, in operation, incoming signals at the input node and
(Continued)

output node of the second delay element are summed together.

13 Claims, 9 Drawing Sheets

(58) Field of Classification Search
CPC ............... H03H 17/0081; H03H 17/02; H03H 17/0288; H03H 2218/04
See application file for complete search history.

(56) References Cited

U.S. PATENT DOCUMENTS

| | | | |
|---|---|---|---|
| 8,798,127 | B2 | 8/2014 | Ding et al. |
| 2004/0021594 | A1* | 2/2004 | Melanson ............ H03M 7/3006 341/143 |
| 2004/0196085 | A1 | 10/2004 | Shen |
| 2007/0147559 | A1 | 6/2007 | Lapointe |
| 2009/0150468 | A1* | 6/2009 | Fifield ................ H03H 17/0227 708/301 |
| 2015/0311671 | A1* | 10/2015 | Bhullar .................. H04B 10/58 372/38.02 |

FOREIGN PATENT DOCUMENTS

| | | |
|---|---|---|
| CN | 103825604 A | 5/2014 |
| EP | 0292058 A1 | 11/1988 |
| JP | 60165114 A * | 8/1985 ............. H03H 17/02 |
| JP | S60165114 A | 8/1985 |
| WO | 2012052807 A1 | 4/2012 |

OTHER PUBLICATIONS

UC Berkeley EECS Dept. Implementation of FIR filters. 2001 [Retrieved Mar. 5, 2024]. Retrieved from Internet: < URL:https://web.archive.org/web/20210506095343/https://ptolemy.berkeley.edu/eecs20/week12/implementation.html>. (Year: 2001).*
Hurst, Aaron & Brayton, Robert. (2006). The advantages of latch-based design under process variation. (Year: 2006).*
Vityazev, A. Kharin, A. Kalinkin and V. Vityazev, "Parallel form of FIR filter for implementation on multicore DSP," 2014 3rd Mediterranean Conference on Embedded Computing (MECO), Budva, Montenegro, 2014, pp. 177-179, doi: 10.1109/MECO.2014.6862688. (Year: 2014).*
Vaidyanathan, "Passive Cascaded-Lattice Structures for Low-Sensitivity FIR Filter Design, with Applications to Filter Banks", IEEE Transactions on Circuits and Systems, vol. CAS-33, No. 11, New York, USA, Nov. 1, 1986, 20 pages.
International Search Report and Written Opinion from PCT Application No. PCT/EP2019/075773, Jan. 8, 2020.
Extended Search Report from corresponding EP Application No. EP18197342.1, Mar. 11, 2019.
Chinese Office Action from Corresponding Chinese Patent Application No. CN201980056896.6, Dec. 4, 2023.

* cited by examiner

CASCADABLE FILTER ARCHITECTURE

FIELD OF THE INVENTION

The present invention relates to the field of high-speed communication and supporting transceiver structures for such high-speed communication. More specifically it relates to building blocks for filtering signals and filters made using these building blocks.

BACKGROUND OF THE INVENTION

While fundamentally, the limit on the achievable bitrate in a communication link is governed by the Shannon-Hartley theorem and hence signal-to-noise ratio, in practice and especially in high speed data communication links, the maximum achievable bitrate can be severely limited by the amount of distortion that the electrical signals experience. Both linear (e.g. bandwidth limitation) and nonlinear (e.g. compression) distortion can be present. To increase the bitrate, compensation for the induced distortion must be applied, which is commonly known as equalization of the signal. Both digital and analog approaches are used for this equalization. The most widely used solution consists of digitizing the input signal with an analog-to-digital converter (ADC) and uses digital signal processing (DSP) to recover the transmitted data. A widely used DSP technique is based on digital filtering with a finite impulse response filter (FIR). As data rates increase, digital equalization consumes significant electrical power due to the necessary power-hungry ADC's. For this reason, analog filtering (eg. FIR equivalent filtering) is more attractive for high speed signals. However, its implementation is not straightforward, and several problems are present.

In all analog FIR equivalents, one filters an analog signal x(t) to become the analog signal y(t) at the output using n degrees of freedom, where n−1 is the order of the filter. The filtering is performed according to the following equation:

$$y(t) = \sum_{i=0}^{n-1} h_i x(t - iT_d)$$

This filter is also commonly known as a feedforward equalizer (FFE). The symbols $h_i$ represent the filter coefficients or tap values. The value $T_d$ represents the 'tap delay' in the filter, which can be chosen depending on the application. This delay must be physically introduced by the filter implementation and is one of the main difficulties in analog FIR filter design. Commonly, $T_d$ is chosen (approximately) equal to the symbol period (symbol spaced FFE) or half of the symbol period (fractionally spaced FFE) of the incoming signal x(t). The FFE can be implemented as a structure consisting of these delay elements combined with multipliers and summers. When implementing such structure at high-speed, the following specific problems are encountered.

A first problem relates to the node complexity. Increasing the order of the FIR filter requires more components (multipliers and adders), while at the same time more of these components may need to be connected to single nodes in the filter. The electrical loads from the components on these nodes introduce additional bandwidth limitations in the filter, limiting the performance (e.g. achievable speed, or achievable order for a given speed) of the equalizer. In high-speed design, the node with the highest load (i.e. with the highest amount of components connected to that node) commonly determines the maximum performance.

A second problem relates to the number of delay elements and the clock frequency. When the order of the FIR filter increases, the amount of components increases which is especially true for the amount of components which realize the time delay $T_d$. There are two ways in which this delay can be implemented: active delay cells or passive structures (transmission lines or lumped equivalents, passive filters . . . ). Active delay cells (i.e. involving active devices such as transistors) have the advantage of requiring only a reasonably small circuit area but may be limited in achievable speed compared to passive structures. Active delay cells can be designed to be linear (although inevitably a certain amount of non-linear distortion will be introduced by the transistors) or can also be implemented in the digital domain using e.g. a flip-flop. The latter is only possible if the input to that delay cell is a binary logic signal. Linear active delay cells can be continuous-time (in which case circuit elements will define the delay), or can use sample-and-hold circuits (in which case the delay is set by the sampling clock). In active (i.e. involving active devices such as transistors) implementations of this time delay, nonlinear distortion is added by each delay block and hence more distortion is added if the order increases. The speed of a FIR filter implemented with clocked active delay cells (whether these are linear sample-and-hold or digital flip-flops) is set by the maximum clock frequency that these cells can handle. While practical filter implementations using transmission lines today achieve the highest speeds, the transmission lines require large circuit area as significant lengths of transmission lines are required to achieve sufficient time delay. The area required for the transmission lines can be so large that it can limit the order of the filter in practical implementations intended for high-speed operation. Furthermore, passive delay lines are lossy, requiring additional amplification to compensate the signal attenuation.

For the implementation of the FIR filter or FFE structure described in the formula above, several well-known filter topologies exist, which can be divided in different groups by looking at their equivalent signal flow graphs.

FIG. 1 shows the equivalent signal flow of a FIR filter in accordance with the formula above. For a symbol spaced FFE, each delay value is preferably equal to the symbol period $T_S$ and for a n-order filter n−1 of them are necessary. All the delay cells have as input a delayed version of the input signal and can therefore be implemented as either active cells (linear, clocked sample-and-hold or digital) or passive cells. In case the signal x(t) is a logical binary signal, the delay elements can be digital flip-flops which would make this architecture viable for a mixed-mode equalizer structure (combination of analog and digital blocks). In such equalizers some or all of the delay cells can be implemented as digital flip-flops The main limitation of this architecture is located at the summation node which becomes more and more bandwidth limiting as the filter order increases. In addition, note how for each increase in filter order, a new summer must be designed and realized. This structure is therefore not implementable as a cascade of unit cells for which the components do not need any re-design when increasing the filter order.

A second prior art topology is based on the transposed direct implementation of a FIR filter. The equivalent signal flow graph thereof is shown illustrated in FIG. 2. In this prior example the separate delay values are equal to the symbol period $T_S$ and n−1 of them are present. The main limitation of this architecture is located at the input node which becomes more and more bandwidth limiting as the filter order increases. The summation is performed in a distributed way reducing bandwidth limitation in the summation compared to the direct implementation. Note how the input of each delay cell equals the input signal multiplied by the corresponding filter coefficient. This implies that the delay cells need to be linear, thus excluding the use of digital flip-flops as delay cells. This structure is not implementable in unit cells as for each increase in order, the input node becomes more complex.

A third prior art topology is based on the distributed implementation of a FIR filter. The equivalent signal flow graph thereof is shown in FIG. 3. In this example a symbol spaced example is given with separate delay values equal to $aT_s$ or $(1-a)T_s$, with $a<1$ and typically equal to 0.5, and $2(n-1)$ of them are present. In case the signal x(t) is a binary logical signal, the delay elements of the input delay line can be digital flip-flops. This makes this architecture viable for a mixed-mode equalizer structure.

However, due to the fractional delay of $aT_s$, a clocked solution is not implementable without additional oversampling. In all cases, the delay elements of the output delay line should be linear. This structure is implementable in unit cells as for each order, 2 delay cells and an amplifier can be cascaded without affecting the first taps of the equalizer, and without changing the load on the input and output nodes.

In view of the prior art examples cited above there is a need for building blocks which can be used for filtering incoming signals, which can be cascaded without increasing the node complexity, which can be used in a mixed-mode structure for multilevel modulation formats.

SUMMARY OF THE INVENTION

It is an object of embodiments of the present invention to provide a good building block for filtering an incoming signal and to provide a filter comprising a number of such building blocks and to provide a multilevel signal generator comprising a number of such filters.

The above objective is accomplished by a method and device according to the present invention.

In a first aspect embodiments of the present invention relate to a filter comprising cascaded building blocks for filtering an incoming signal. Each building block comprises:
- a first delay element having a first delay, and a second delay element having a second delay.
- a first scaling device between an input node of the first delay element and an output node of the second delay element,
- a second scaling device between an output node of the first delay element and an input node of the second delay element.

The building block moreover comprises:
- a first cross scaling device connected between the output node of the first delay element and the output node of the second delay element,
- and/or a second cross scaling device between the input node of the first delay element and the input node of the second delay element wherein the building block is configured such that, in operation, incoming signals at the input node and output node of the second delay element are summed together.

The building blocks are cascaded with a first building block as earliest building block. In these filters the output of the first delay element of an earlier building block is connected with the input of the first delay element of a following building block, and the output of the second delay element of the following building block is connected with the input of the second delay element of the earlier building block, such that when an incoming signal is applied to the input of the first delay element of the first building block an output signal can be obtained at the output of the second delay element of the first building block.

It is an advantage of embodiments of the present invention that a higher order transversal filter can be obtained by cascading building blocks in accordance with embodiments of the present invention.

When an incoming signal is applied to the input of the first delay element of the first building block a filtered signal can be obtained at the output of the second delay element of the first building block.

It is an advantage of embodiments of the present invention that the nodes where the outputs of the scaling devices are summed together are distributed (i.e. they are distributed over the inputs and outputs of the second delay elements.) There is therefore a maximum load on each of these inputs and outputs. The building blocks are therefore cascadable without reducing the bandwidth.

The scaling devices or cross scaling devices may be implemented as amplifiers or attenuators.

It is an advantage of embodiments of the present invention that with two delay elements a 4 taps transversal filter can be made. Thus, a lower complexity can be obtained.

In embodiments of the present invention the scaling devices are connected such that in operation signals from the scaling devices which are connected with the output node of the second delay element are summed at this output node, and such that in operation signals from the scaling devices which are connected with the input node of the second delay element are summed at this input node.

In embodiments of the present invention the first delay element and the scaling devices are non-linear.

It is an advantage of embodiments of the present invention that when the incoming signal is a binary signal all blocks before the summation can be non-linear. This results in a significant area and power optimization. When, for example, the delay of the first delay element is the double of the delay of the second delay element, ⅔ of the delay can be non-linear. Thus, a mixed mode filter can be realized with the same benefits as the benefits of a linear filter. This filter can be used to spectrally shape signals to equalize the impulse response of a communication channel.

In embodiments of the present invention at least part of the delay elements and/or at least part of the scaling devices may be digitally implemented.

In embodiments of the present invention the first delay element is implemented using one or more latches.

In embodiments of the present invention the delay elements are implemented by delaying demultiplexed versions of the incoming signal and multiplexing again these signals.

In embodiments of the present invention the first or the second delay element may be implemented as a transmission line. A delay element may also be implemented as an active delay element (all-pass filter). A delay element may also be implemented as a sample and hold circuit or as an LC delay line.

In embodiments of the present invention at least one of the scaling devices can have an amplification which is adjustable.

Building blocks according to embodiments of the present invention may comprise the first cross scaling device and the second cross scaling device. In these embodiments the first delay may for example be the double of the second delay or the second delay may for example be the double of the first delay.

In this way, a uniformly symbol-spaced filter is obtained. In embodiments of the present invention the delays are equal to or a multiple of the symbol period. This has as advantage that these values can be easily generated in clocked input signal of S/H systems where only 1 phase clock can be used (without oversampling).

Building blocks according to embodiments of the present invention may for example comprise either the first cross scaling device or the second cross scaling device. In these embodiments the first delay may for example be equal to the second delay.

In embodiments of the present invention the first delay and/or the second delay are adjustable.

It is an advantage of embodiments of the present invention that the delay values can be scaled to the user's needs.

In embodiments of the present invention the second scaling device of the earlier building block is the same as the first scaling device of the following building block.

In embodiments of the present invention a ratio between the first delay and the second delay is the same for all building blocks.

It is an advantage of embodiments of the present invention that a uniform distribution of the taps can be obtained.

In embodiments of the present invention the direction of the second delay element may be reversed or the second delay element may be a bidirectional delay element. A useful signal can sum at the input of the second delay cell. In that case, here also a controllable and useful filtered version of the input can be found.

In a second aspect embodiments of the present invention relate to a multilevel signal generator comprising a predefined number of filters according to embodiments of the present invention. There filters have the same number of building blocks and are connected in parallel. A first filter is connected in parallel with a second filter if:

the input of the second delay element of a building block of the first filter is connected with the input of the second delay element of the corresponding building block of the second filter and if the output of the second delay element of a building block of the first filter is connected with the output of the second delay element of the corresponding building block of the second filter, such that when an incoming signal is applied to the input of the first delay element of the first building block of the first filter, and when an incoming signal is applied to the input of the first delay element of the first building block of the second filter, an output signal can be obtained at the output of the second delay element of the first building block of the first and the second filter.

It is an advantage of embodiments of the present invention that different binary streams can be combined. By cascading and stacking building blocks according to embodiments of the present invention the complexity of the multilevel signal generator can be reduced because of the cross-scaling devices compared to systems which do not comprise these cross-scaling devices. The number of delay blocks and the required node complexity (at the summation) can be reduced compared to systems which do not comprise these cross-scaling devices.

In embodiments of the present invention the second delay element of a building block of the first filter is the same as the second delay element of the corresponding building block of the second filter.

In embodiments of the present invention the predefined number of filters is 2.

It is an advantage of embodiments of the present invention that a PAM-4 generation can be realized by connecting two filters in parallel. In general the input delay line and scaling devices can be implemented M times in parallel to simultaneous generate and filter ($2^M$-PAM) signaling from 2-level input data.

In the complex filter, the complex input delay line and complex scaling devices can be implemented M times in parallel to simultaneous generate and filter multilevel ($2^{2M}$-QAM) signaling from 2 level input data.

In a third aspect embodiments of the present invention relate to complex multilevel signal generator, comprising two multilevel signal generators according to embodiments of the present invention. Each multilevel signal generator comprises the same even number of filters (half for the real signals, half for the imaginary signals). Pairs of filters are formed by connecting the first delay elements of corresponding filters of the two multilevel signal generators in parallel.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
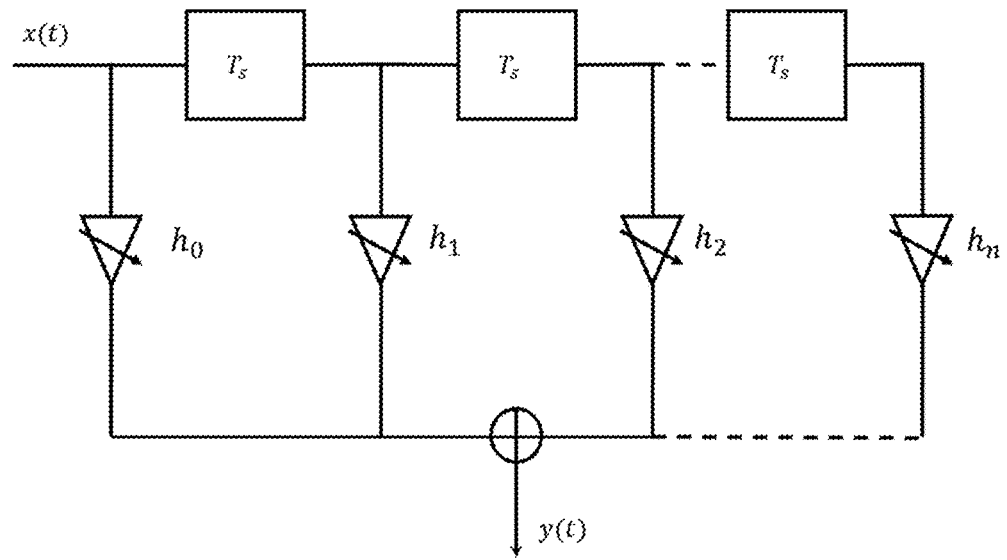
FIG. 1 shows the equivalent signal flow of a prior art direct implementation of a FIR filter.
Figure 2:
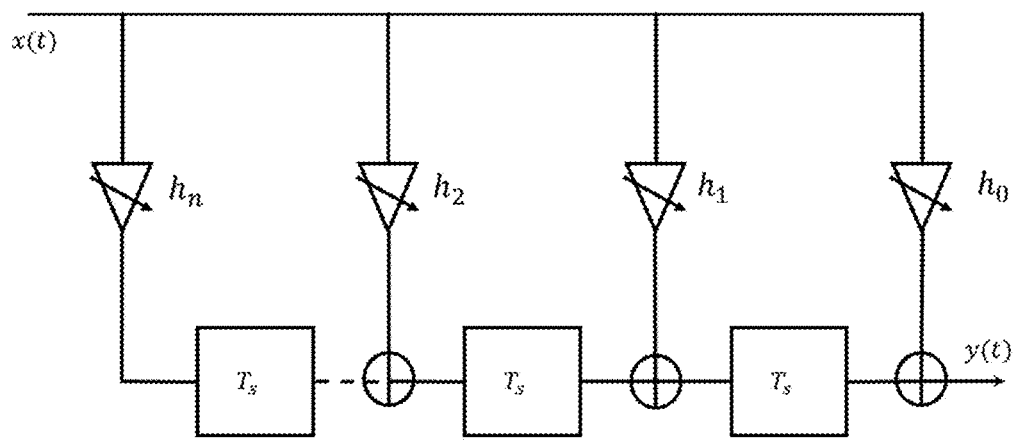
FIG. 2 shows the equivalent signal flow of a prior art transposed direct implementation of a FIR filter.
Figure 3:
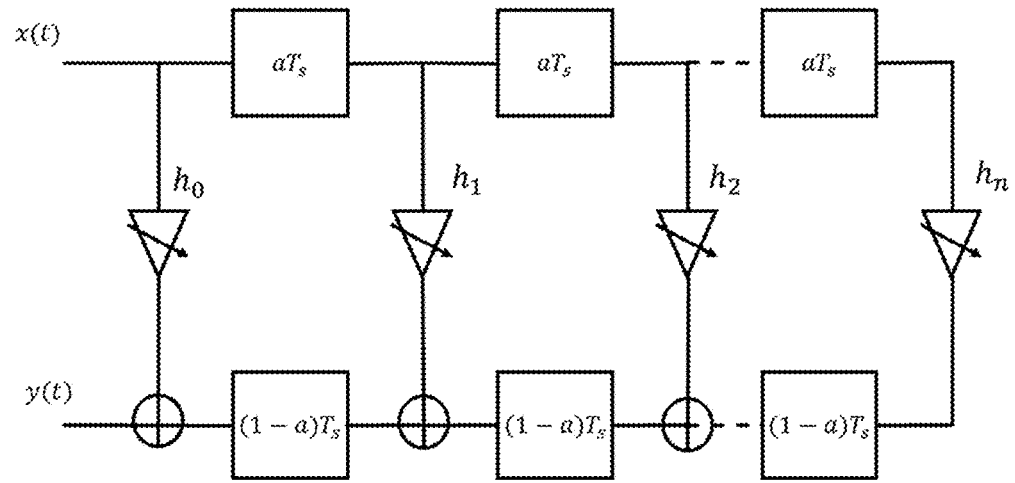
FIG. 3 shows the equivalent signal flow of a prior art distributed implementation of a FIR filter.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In a first aspect embodiments of the present invention relate to a filter 200 comprising a number of cascaded building blocks 100 for filtering an incoming signal. Each building block 100, also referred as unit cell, has a topology which is especially suited for building the filter 200. It may for example be used for implementing an analog (mixed-mode) FIR filter.

Figure 4:
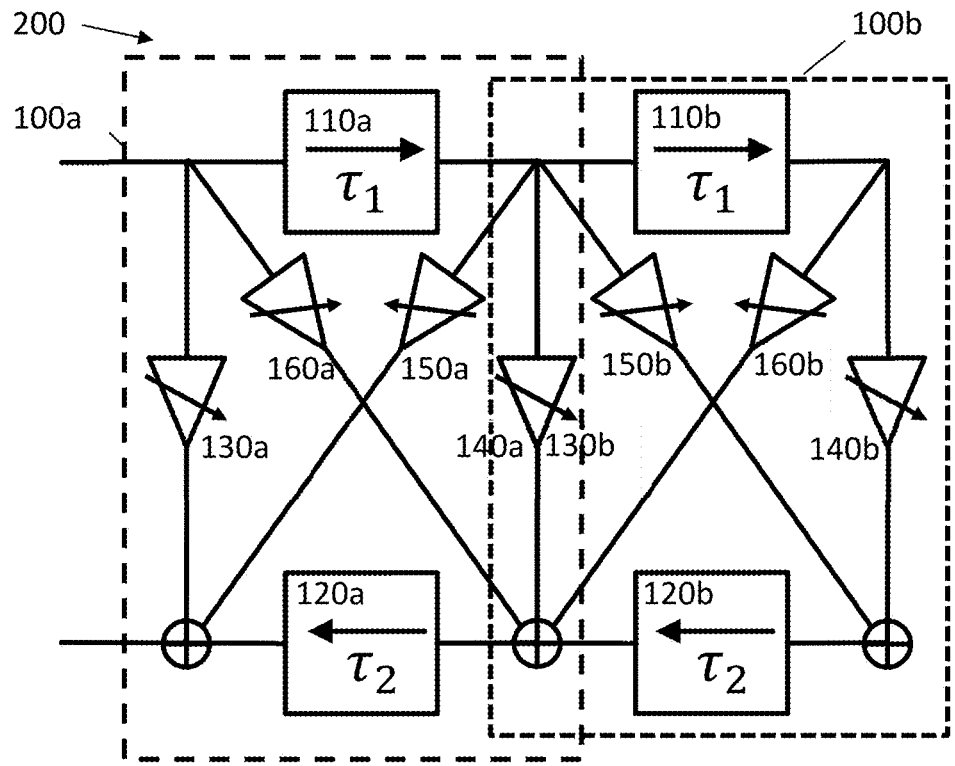
FIG. 4 shows a schematic drawing of a filter comprising two building blocks in accordance with embodiments of the present invention.

The basic elements and topology of such a building block will therefore be explained with the aid of the signal flow graph of a filter 200 in accordance with embodiments of the present invention and illustrated in FIG. 4.

Each building block 100a, 100b can be used for filtering an incoming signal. Each building block comprises a first delay element 110a, 110b having a first delay $\tau_1$, and a second delay element 120a, 120b having a second delay $\tau_2$.

Scaling devices, this may be amplifiers or attenuators, are present between the inputs and outputs of the delay elements. A first scaling device 130a, 130b is present between an input node of the first delay element 110a, 110b and an output node of the second delay element 120a, 120b. A second scaling device 140a, 140b is present between an output node of the first delay element 110a, 110b and an input node of the second delay element 120a, 120b.

Each building block 100a, 100b moreover comprises a first cross scaling device 150a, 150b connected between the output node of the first delay element 110a, 110b and the output node of the second delay element 120a, 120b, and/or a second cross scaling device 160a, 160b between the input node of the first delay element 110a, 110b and the input node of the second delay element 120a, 120b.

When an incoming signal is applied to the input node of the first delay element 110a, 110b a filtered signal can be obtained at the output node of the second delay element 120a, 120b. Each building bock 100a, 100b is configured such that incoming signals at the input node and output node of the second delay element 120a, 120b are summed together.

Figure 5:
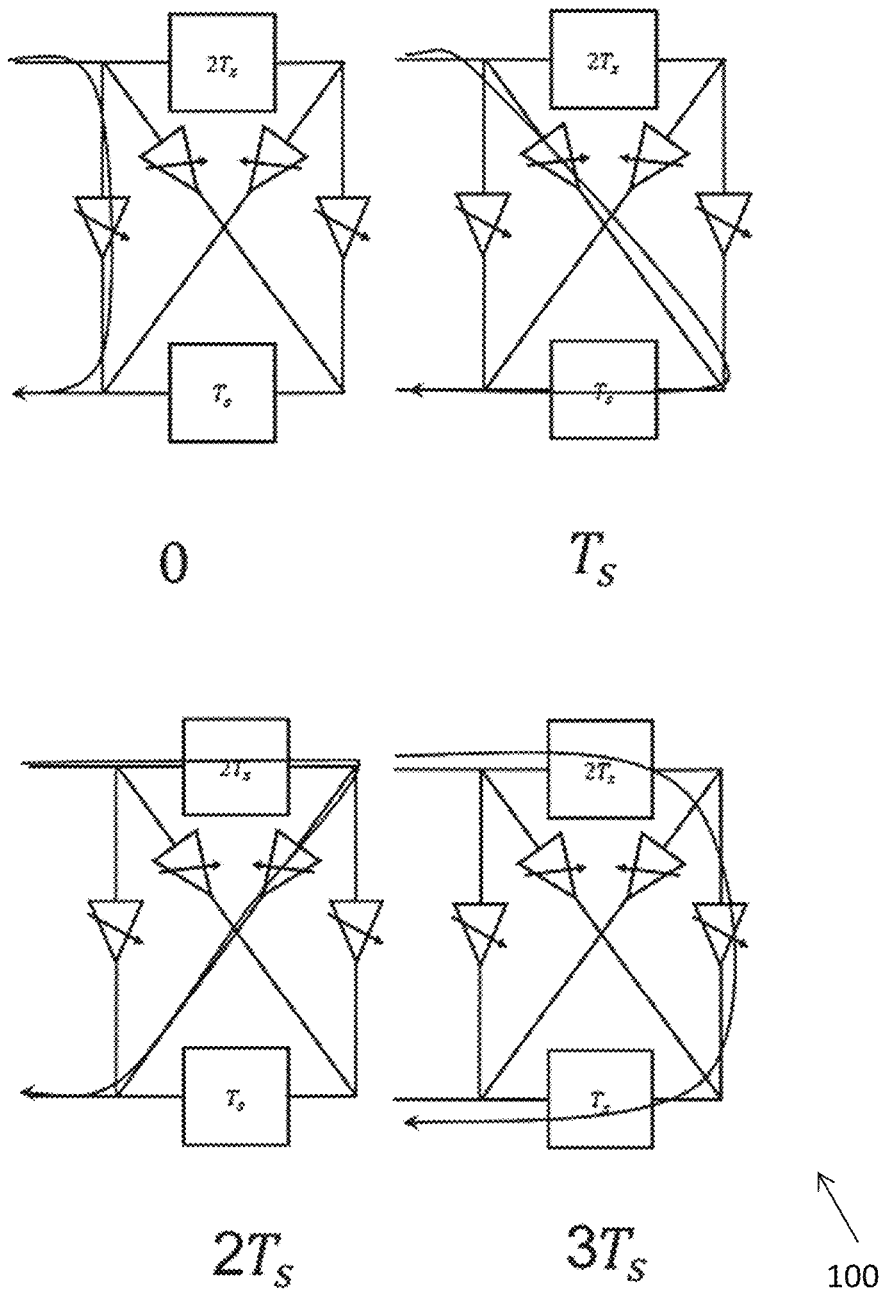
FIG. 5 shows the operation principle of a building block of a filter in accordance with embodiments of the present invention.

Using such a building block with 2 delay elements a 4 taps transversal filter can be made. This is illustrated in FIG. 5. In this example, 4 filter taps with different delays are schematically illustrated. In embodiments of the present invention the tap delay value $T_d$ may be equal to the symbol period $T_S$ (in the example of FIG. 5 $\tau_1$ is equal to $2T_s$ and $\tau_2$ is equal to $T_s$). In that case symbol spaced FIR equalizers are discussed (i.e. the same new topology can also be used to realize fractionally spaced FIR filters). For example, for a 100 Gbd signal, $\tau_1$ may be selected 20 ps, and $\tau_2$ may be selected 10 ps to realize a symbol spaced filter.

In the exemplary embodiment, illustrated in FIG. 4, the filter is obtained by cascading the first building block 100a and the second building block 100b. The output of the first delay element 110a of the first building block 100a is connected with the input of the first delay element 110b of the second building block 100b, and the output of the second delay element 120b of the second building block 100b is connected with the input of the second delay element 120a of the first building block 100a. The configuration is such that when an incoming signal is applied to the input of the first delay element 110a of the first building block an output signal can be obtained at the output of the second delay element 120a of the first building block.

In the example of FIG. 4 the second scaling device 140a of the first building block is the same as the first scaling device 130b of the second building block.

Figure 6:
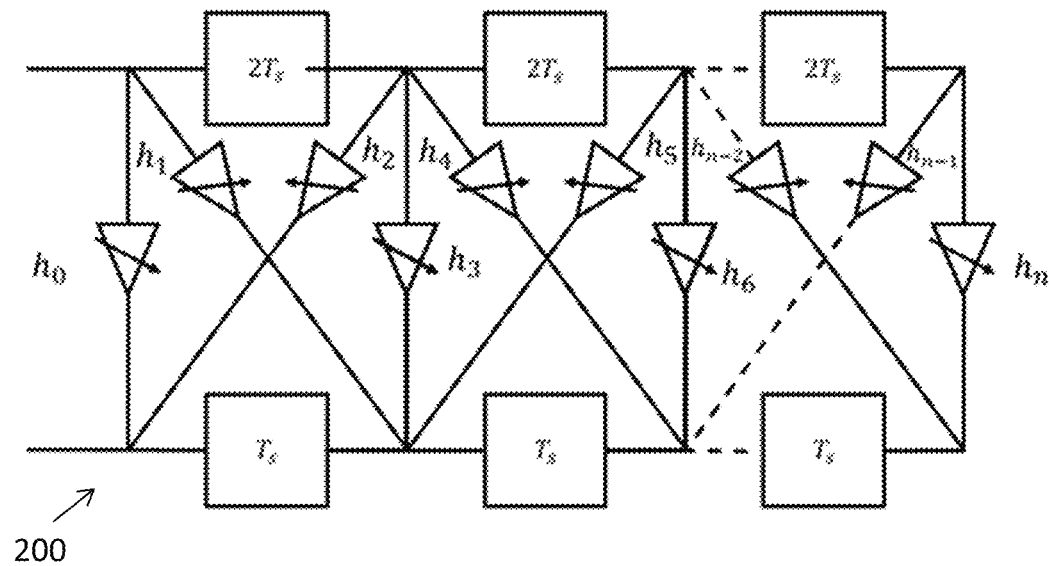
FIG. 6 shows a schematic drawing of a filter comprising cascaded building blocks in accordance with embodiments of the present invention.

In the example of FIG. 4, 2 building blocks are cascaded. The invention is, however, not limited thereto. Thus, a higher order filter can be obtained by cascading the building blocks. This is illustrated in FIG. 6. This architecture is called the full cross filter hereafter. In this example all rectangle blocks represent delay elements with their corresponding delay marked to obtain a uniformly symbol spaced FIR filter ($\tau_1$ is equal to $2T_s$ and $\tau_2$ is equal to $T_s$). All triangles represent scaling devices which are used to tune each degree of freedom in the FIR filter (e.g. variable gain amplifiers (VGA)). Nodes connected to the output of the scaling devices are summation nodes for the signals.

The most essential element in the different embodiments of the present invention are the cross connected scaling devices. These make it possible to implement distributed summation with a reduced amount of delay elements per order.

In this example the number of separate delay elements is ceil(2*(n)/3) with n+1 the number of amplifiers in the filter.

Figure 7:
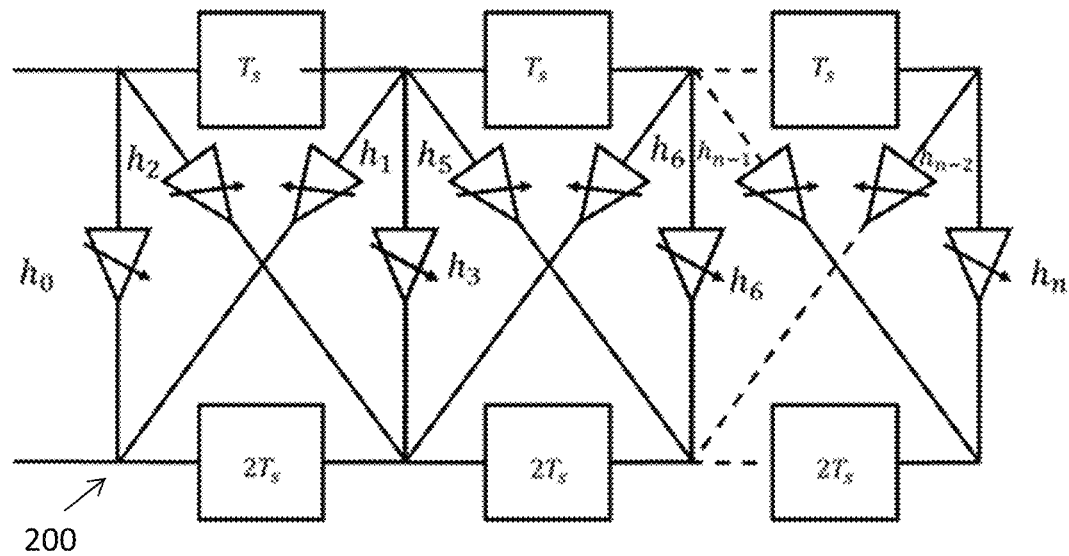
FIG. 7 shows a transposed architecture of a filter in accordance with embodiments of the present invention.

The summation is performed in a distributed way, limiting bandwidth limitation in the summation but loads are higher than in the distributed variant. In case the signal x(t) is a binary logical signal, the delay elements of the input delay line can be digital flip-flops. This makes this architecture viable for a mixed-mode equalizer structure. This structure is implementable in unit cells as for each increase of 3 orders, 2 delay cells and 3 scaling devices can be cascaded without affecting the performance in the first taps of the equalizer. A transposed architecture is possible when the location of the $T_s$ and $2T_s$ blocks are interchanged ($\tau_1$ is equal to $T_s$ and $\tau_2$ is equal to $2T_s$). This is illustrated in FIG. 7.

Figure 8:
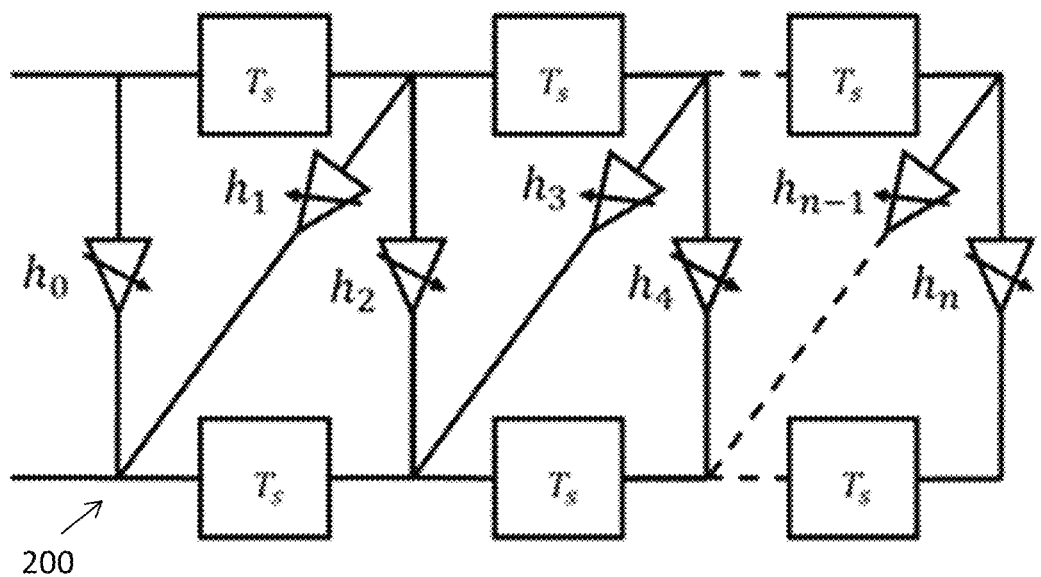
FIG. 8 and FIG. 9 show filters with only one cross scaling device per building block.
Figure 9:
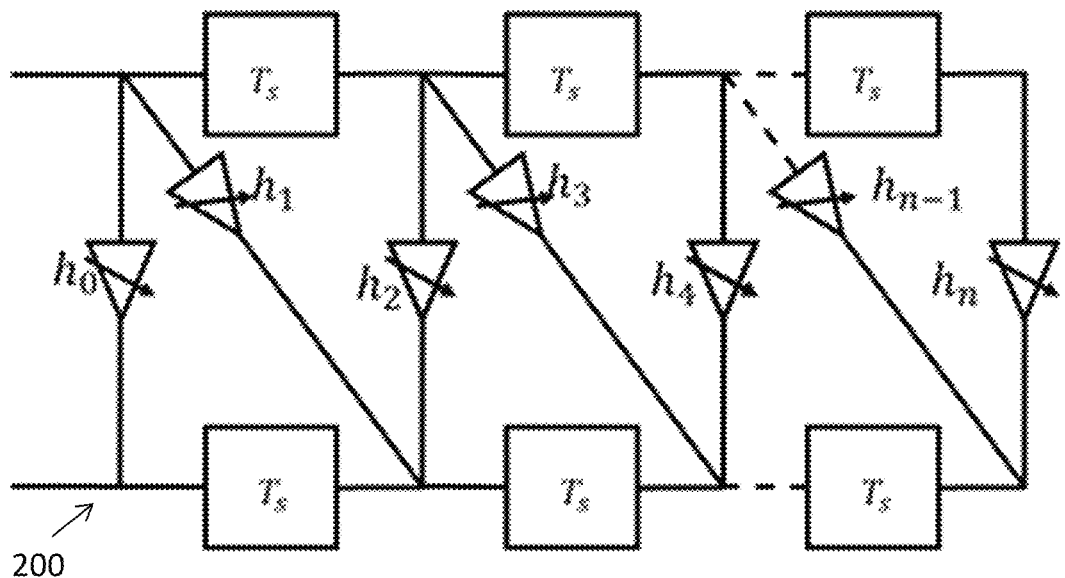

In the exemplary embodiments illustrated in FIGS. 4 to 7, 2 cross scaling devices are used per building block. This is not strictly necessary for the present invention. A building block may as well only comprise the first cross scaling device or the second cross scaling device. Both topologies are shown in FIG. 8 and FIG. 9.

These architectures are further addressed as the half cross filters. To correct for the missing scaling devices, new delay values must be introduced. In this example the separate delay values are all equal to the symbol period $T_s$. In total, n of them are present. The summation is performed in a distributed way limiting bandwidth limitation in the summation, but loads are higher than in the distributed variant. In case the incoming signal x(t) is a binary logical signal, the delay elements of the input delay line can be digital flip-flops. This makes this architecture viable for a mixed-mode equalizer structure. This structure is implementable in unit cells as for each increase of 2 orders, 2 delay cells and 2 scaling devices can be cascaded without affecting the performance in the first taps of the equalizer.

The complete architectures can be both implemented in the analog and digital domain.

The architectures itself are independent of the symbol rate and delay values with respect to the symbol rate. For this purpose, the values can be scaled to the user's needs. However, when one wants to obtain a uniform distribution of the taps, the ratios between forward and backward delays must be kept.

The implementation of the delay elements and scaling devices itself are variable and can be freely chosen by the designer. Both active and passive delay solutions could be used in direct implementations of the delay cells. Using digital flip-flops is also possible (e.g. at the input of the forward delay lines), which omits the physical implementation of the delays but still the same architecture is used. These clocked solutions lead to an efficient mixed-mode filter (e.g. equalizer) structure.

Depending on the situation and application, the scaling devices (e.g. VGAs) can be linear/nonlinear, have a fixed gain/attenuation or a limited gain/attenuation range.

The summation nodes (i.e. the input and output nodes at the second delay elements) can be implemented by analog additions or can be implemented by digital summations in digital designs.

The order of the filter is variable as well. The unit cells can be freely cascaded to reach higher order filters. Not all scaling devices should be physically present if one desires to lower the order of the filter.

All blocks can be implemented as complex scaling devices and delay elements. This means that each delay line is doubled and each scaling device is implemented 4 times and connected properly between the delay line nodes.

The previous discussions of FIR filter topologies can be summarized in following table. For each architecture, the performance with respect to several relevant properties are reported. Again, a symbol spaced FIR filter of the nth order is assumed without loss of generality. The filter order is defined as n. The property "maximum load", is defined as the maximum total sum of incoming and outgoing signals on a node. From the table, it can be concluded that both the full cross and half cross-FIR architecture provide a unique set of properties which address both the problems of node complexity and number delay elements simultaneously.

| FIR topology | # Delay elements | #Linear Delay elements | Delay values | Max. linear delay | #Summation nodes | Max load | Cascadable (order/cascade) | Mixed mode without oversampling |
| --- | --- | --- | --- | --- | --- | --- | --- | --- |
| Direct | n | 0 | $T_s$ | NA | 1 | n + 1 | No | Yes |
| Transposed direct | n | n | $T_s$ | $T_s$ | n | n + 1 | No | NA[2] |
| Distributed | 2n | n | $aT_s$, $(1-a)T_s$ | $(1-a)T_s$ | n | 3 | Yes | No |

-continued

| FIR topology | # Delay elements | #Linear Delay elements | Delay values | Max. linear delay | #Summation nodes | Max load | Cascadable (order/cascade) | Mixed mode without oversampling |
|---|---|---|---|---|---|---|---|---|
| Full cross FIR | Ceil(2*n/3) | $\text{Ceil}\left(\frac{n}{3}\right)$ | $T_s, 2T_s$ | $T_s$ | $1 + \text{Floor}\left(\frac{n}{3}\right)$ | 5 | Yes | Yes |
| Transposed full cross FIR | Ceil(2*n/3) | $\text{Ceil}\left(\frac{n}{3}\right)$ | $T_s, 2T_s$ | $2T_s$ | $1 + \text{Floor}\left(\frac{n}{3}\right)$ | 5 | Yes | Yes |
| Half cross FIR 1 | n | $\text{ceil}\left(\frac{n-1}{2}\right)$ | $T_s$ | $T_s$ | $\text{ceil}\left(\frac{n+1}{2}\right)$ | 4 | Yes | Yes |
| Half cross FIR 2 | n | $\text{ceil}\left(\frac{n}{2}\right)$ | $T_s$ | $T_s$ | $\text{ceil}\left(\frac{n+2}{2}\right)$ | 4 | Yes | Yes |

In the full and half cross-filters illustrated in FIG. 6 to FIG. 9 and for which the parameters are summarized in the table above, the delay values are equal to or a multiple of $T_s$ (similar as the direct implementation). The relation to the symbol period can be advantageous over the distributed implementation as these values can easily be generated in clocked input signals or S/H systems where only 1 phase clock can be used (without oversampling).

The number of delay elements used in the filter should be limited to reduce the introduced distortions. It is therefore advantageous to have as low as possible physical delay elements in e.g. active delay solutions. The full cross filter has the lowest number of delay elements. The half cross filters have n elements, which is still advantageous over the distributed architecture and equal in performance to most other solutions.

Besides the total number of delay elements, the amount of possible delay cells that can be implemented as digital flip-flops is important. In case of binary logical input data, the input delay lines can be replaced by shifted clocked versions of the input data which omits the implementation of these physical delays. Both in the full cross architecture and half cross, half of the delay cells could be omitted in this way. This makes the full cross solution (and half cross) ideally suited for high order mixed-mode equalizer structures.

As, in the full and half cross-filters illustrated in FIG. 6 to FIG. 9, the summation is distributed and an input delay line is used, the maximum load on a node does not increase for higher order implementations (similar as the distributed architecture). This is an advantage in high order filters with stringent bandwidth limitations. Compared to the distributed architecture, the maximum load is higher but still limited.

Both the half cross and full cross solution are implementable in unit cells. This means that in analog implementations, one can increase the order by cascading equal blocks. This has a clear advantage in design as only one unit cell must be designed, independent of the order. The largest benefit, however, can be found in the fact that increasing the order does not affect the performance of filter taps that are generating lower order terms. For example, in the direct implementation, the bandwidth of all taps drops with increasing filter order.

In embodiments of the present invention the first delay element 110 of a building block may be implemented by delaying demultiplexed versions of the incoming signals and by multiplexing again these signals.

Figure 10:
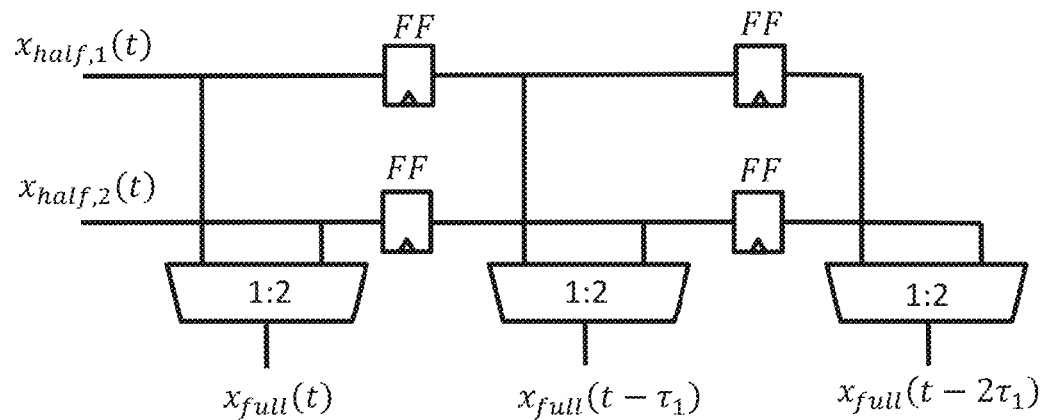
FIG. 10 and FIG. 11 are schematic drawings of first delay elements which are implemented by delaying demultiplexed versions of the incoming signals and by multiplexing again these signals.

An example of a delay element which is adapted for delaying demultiplexed versions ($x_{half,1}(t)$, $x_{half,2}(t)$) at half of the clock rate at which the output signal is sampled, and for multiplexing again these signals is illustrated in FIG. 10. In this example the delay elements are implemented using one or more latches. For example flip flops (FF) comprising 2 latches may be used to generate symbol spaced delays at the half rate. Three multiplexers (1:2) are used for multiplexing the signals. A non-delayed version of the incoming signal $x_{full}(t)$ and two delayed versions $x_{full}(t-\tau_1)$ and $x_{full}(t-2\tau_1)$ are obtained.

Figure 11:
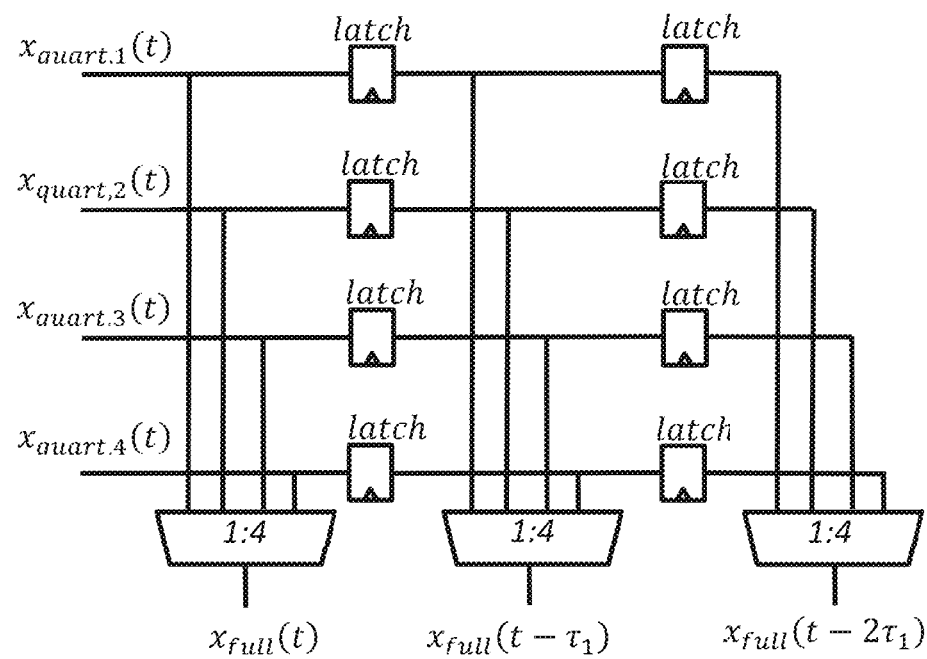

An example of a delay element which is adapted for delaying demultiplexed versions ($x_{quart,1}(t)$, $x_{quart,2}(t)$, $x_{quart,3}(t)$, $x_{quart,4}(t)$) at a quarter of the clock rate, and for multiplexing again these signals is illustrated in FIG. 11. In this example the delay elements are implemented using latches (latch). Three multiplexers (1:4) are used for multiplexing the signals. A non-delayed version of the incoming signal $x_{full}(t)$ and two delayed versions $x_{full}(t-\tau_1)$ and $x_{full}(t-2\tau_1)$ are obtained.

One of the main disadvantages in the full cross architecture is the presence of delay values of $2T_s$. In simple analog active delay solutions (first order solutions), it is difficult to implement these large values without too much group delay distortion. If sub-symbol spaced analog equalizers with active delays are intended, the group delay distortion with respect to the symbol period will be much lower and the disadvantage of the high delay value can be dropped.

On the other hand, if one intends to keep the group delay distortion low in symbol spaced equalizers, higher order delay cells are necessary increasing the apparent number of delay cells per filter order.

When clocked implementations are used, the problems arising from the $2T_s$ delay values can be easily overcome by using a divided clock.

In a second aspect, embodiments of the present invention relate to a multilevel signal generator 300 comprising a predefined number of filters 200 in accordance with embodiments of the present invention. In such a multilevel signal generator the filters have the same number of building blocks and are connected in parallel. A first filter is connected in parallel with a second filter by connecting the input of the second delay element of a building block of the first filter with the input of the second delay element of the corresponding building block of the second filter and by connecting the output of the second delay element of a building block of the first filter with the output of the second delay element of the corresponding building block of the second filter. The connection is done such that when an incoming signal is applied to the input of the first delay element 110 of the first building block of the first filter, and when an incoming signal is applied to the input of the first delay element 110 of the first building block of the second filter, an output signal can be obtained at the output of the second delay element 120 of the first building block of the first and the second filter. The incoming signals at the input node of the second delay element are summed together and the incoming signals at the output node of the second delay element are summed together. The second delay element of the first building block may be the same as the second delay element of the second building block.

The input delay line and scaling devices can be implemented M times in parallel to simultaneous generate and equalize multilevel ($2^M$-PAM) signaling from 2 level input data.

Figure 12:
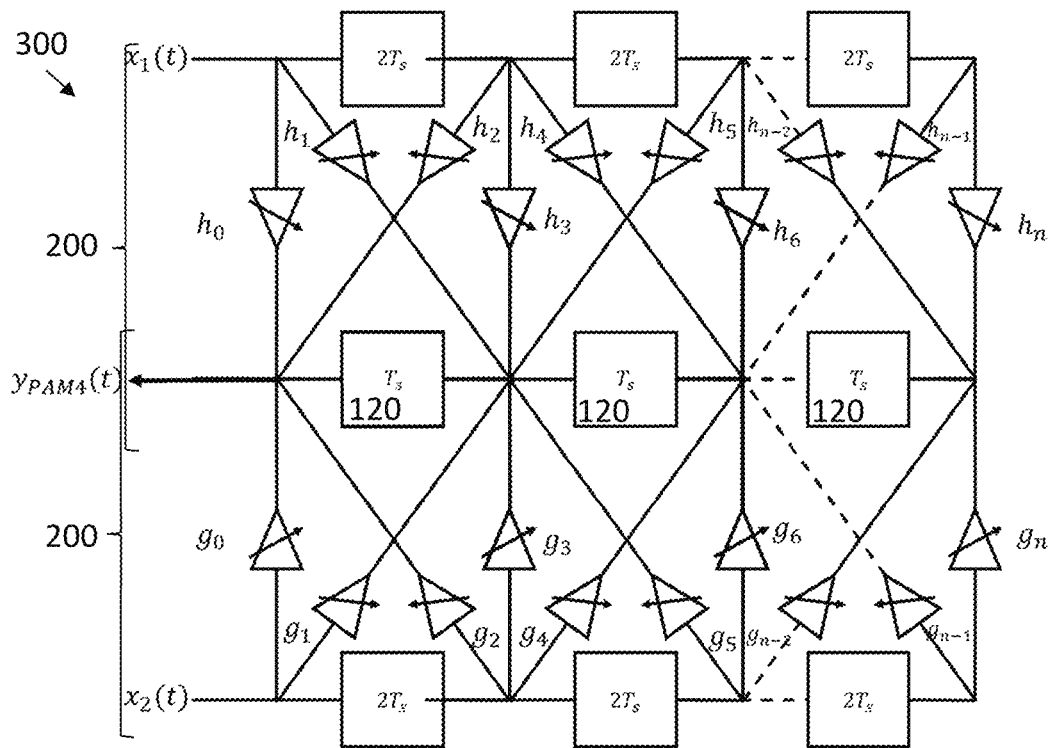
FIG. 12 shows an example of a PAM-4 modulation scheme according to a multilevel signal generator in accordance with embodiments of the present invention.

An example for PAM4 modulation is illustrated in FIG. 12. In this example two filters 200 are put in parallel and the second delay elements 120 are shared between the filters.

Figure 13:
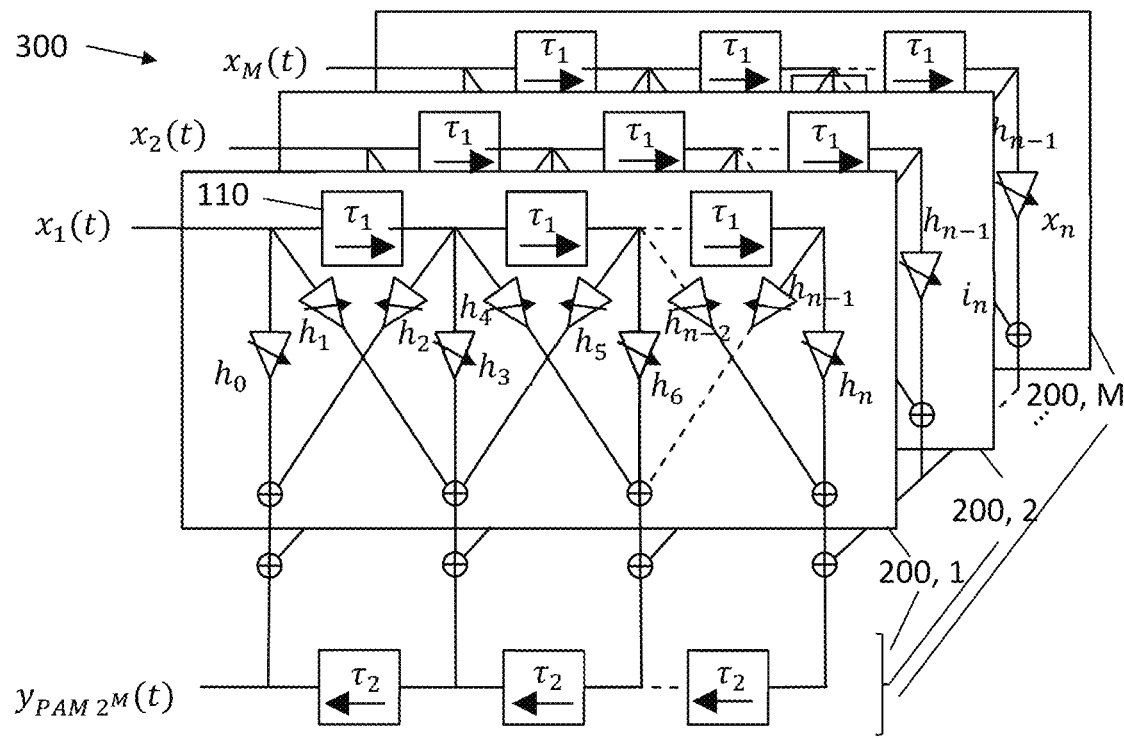
FIG. 13 shows an example of a PAM-$2^M$ modulation scheme according to a multilevel signal generator in accordance with embodiments of the present invention.

In FIG. 13 this is extended to PAM-$2^M$ signal generation. In this example M filters (200, 1; 200, 2; . . . ; 200, M) are put in parallel and the second delay elements are shared between the filters. When applying input signals $x_1(t)$ to $x_m(t)$ to the respective input nodes an output signal $y_{PAM\ 2}{}^M(t)$ is obtained at the output node of the multilevel signal generator.

In a third aspect embodiments of the present invention relate to a complex multilevel signal generator 400. Such a complex multilevel signal generator comprises two multilevel signal generators 300A, 300B each comprising the same even number of filters (half for the real or inphase signals, half for the imaginary/quadrature signals) connected one by one with each other wherein the first delay elements of corresponding filters are connected in parallel.

Figure 14:
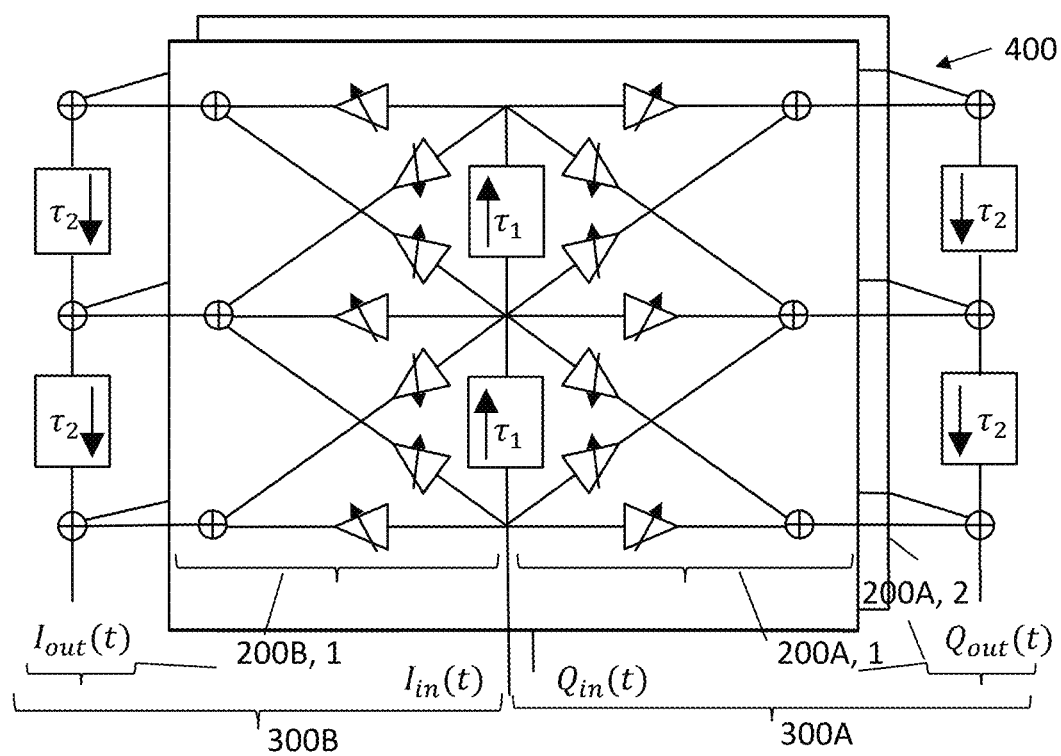
FIG. 14 shows a 4-QAM complex signal generator in accordance with embodiments of the present invention.

FIG. 14 shows a 4-QAM complex signal generator in accordance with embodiments of the present invention. This figure shows a first multilevel signal generator 300A and a second multilevel signal generator 300B. The first multilevel signal generator 300A comprises a first filter 200A, 1 and a second filter 200A, 2. The second multilevel signal generator 300B comprises a first filter 200B, 1 and a second filter (hidden behind 200 B, 1). The first delay elements (with delay $\tau_1$) of the first filters of both multilevel signal generators are connected in parallel. Also, the first delay elements of the second filters of both multilevel signal generators are connected in parallel. The first delay elements are shared between the coupled filters.

The in-phase data $I_{in}(t)$ is applied to the input of the first delay element of the first building block of the first filters and the quadrature-phase $Q_{in}(t)$ is applied to the input of the first delay element of the first building block of the second filters.

The quadrature-phase output signal $Q_{out}(t)$ can be retrieved from the output of the delay element of the first building block of the first multilevel signal generator 300A. The in-phase output signal $I_{out}(t)$ can be retrieved from the output of the delay element of the first building block of the second multilevel signal generator 300B.

Figure 15:
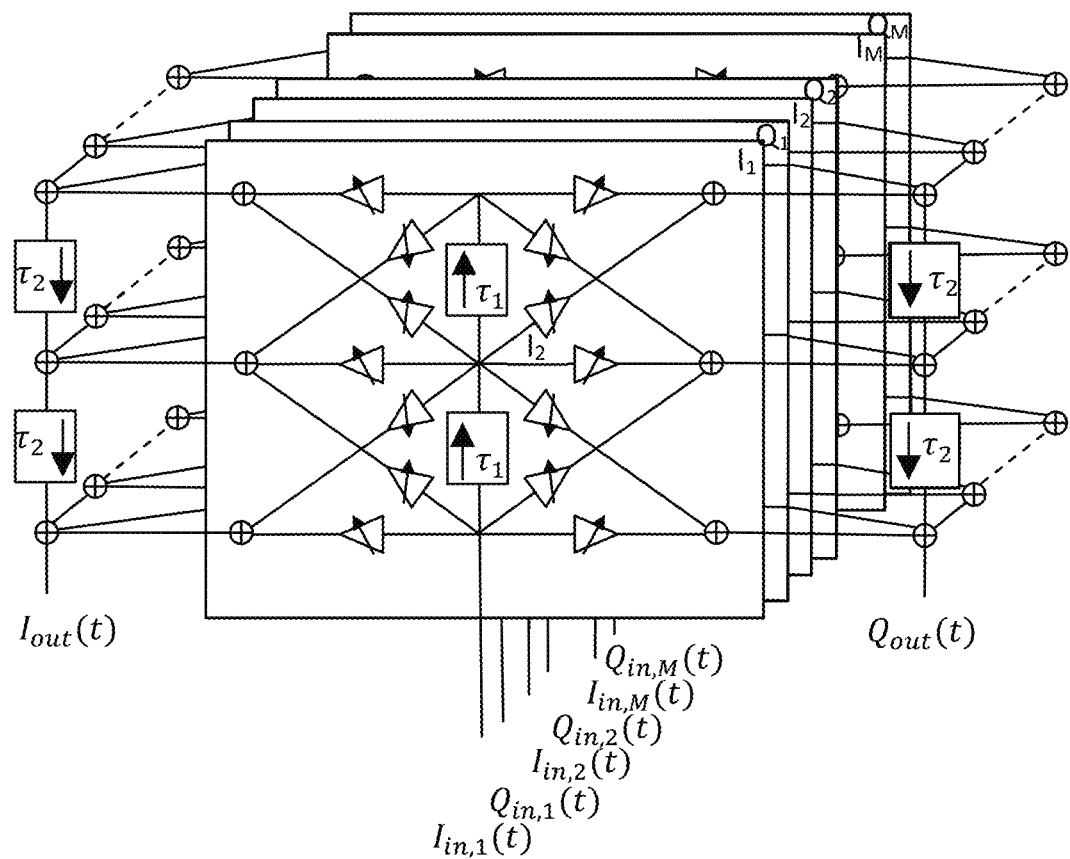
FIG. 15 shows a $2^{2M}$-QAM complex multilevel signal generator in accordance with embodiments of the present invention.

FIG. 15 shows a $2^{2M}$-QAM complex multilevel signal generator in accordance with embodiments of the present invention. Pairs of filters are formed by connecting the first delay elements of corresponding filters of the two multilevel signal generators in parallel. The in-phase and quadrature input signals $I_{in,0}(t)$, $Q_{in,0}(t)$, $I_{in,1}(t)$, $Q_{in,1}(t)$, . . . $I_{in,M}(t)$, $Q_{in,M}(t)$ are connected to the filter inputs and the in-phase and quadrature output signals $I_{out}(t)$, $Q_{out}(t)$ are obtained from the filter outputs.

From the embodiments explained above it can be concluded that it is an advantage of embodiments of the present invention that the maximum number of components connected to a single node can be limited, independent of the filter order. Hence the filter order can be increased without reducing the bandwidth of the filter.

It is an advantage of embodiments of the present invention that the amount of delay cells required for a given order is reduced compared to existing filter implementations, thus reducing power and/or circuit area compared to existing implementations. In addition, when using clocked active delay cells, a filter topology according to embodiments of the present invention allows lower clock frequencies compared to several existing high-speed filter structures.

Building blocks according to embodiments of the present invention may be used as area efficient mixed-mode equalizer structures for multi-level modulation formats.

They can be implemented as FIR filters to overcome bandwidth limitations in communication links. They can be integrated at either the transmitter or at the receiver side. Transmit side equalization has the advantage that the error-free data to be transmitted is readily available, but poses challenges while adjusting the tap coefficients (as the link information required for setting the tap values is in principle only known at the receiver). Receiver side equalization does not have this problem, however needs to handle signals that may have undergone significant attenuation by the link. Therefore, it is interesting to pre-compensate the frequency dependent loss of the overall link at the transmit side.

As mentioned above, the delay cells required to realize a FIR filter can be implemented as digital flipflops, provided the input to these delay cells is a binary logic signal. This is the normal case for transmit side equalizers. Compared to passive delay line structures using transmission lines, digital flip-flops require significantly less area (several orders of magnitude), which is advantageous not only from a cost perspective but also because it allows scaling the equalizer more readily to higher orders. It is therefore an advantage of embodiments of the present invention that transmit side equalizers can be realized with a topology of the FIR filter with a large fraction of the delay cells having binary logic signals as their inputs.

An important extension occurs when transmitting multi-level modulation formats (e.g. M-ary pulse amplitude modulation). In one possible implementation, a transmitter receives a number of binary logic bitstreams and converts these to an $2^M$-PAM output signal. A problem then is how to combine these different bitstreams into this $2^M$-PAM output signal, while simultaneously performing equalization preferably with a significant amount of delay cells implemented as digital flip-flops. It is an advantage of embodiments of the present invention that both the node complexity problem and the number of delay elements problem are tackled, especially when increasing the modulation order M. In contrast to conventional equalizer solutions, which are optimized to address either the node complexity problem or the number of delay elements problem, in embodiments of the present invention both problems are tackled simultaneously, which makes it ideally suited for multilevel modulation mixed mode equalizers.

The concept of the cascadable building blocks can be implemented as filtering architecture for high speed data communications. It can for example extent current NRZ transmitters with equalizing and multi-level signal generation.

Embodiments of the present invention may for example be implemented using CMOS or BiCMOS process technology.

The invention claimed is:

1. A filter for filtering an incoming signal and obtaining a filtered output signal, the filter comprising a plurality of building blocks, each building block comprising:
   a first delay element configured for realizing a first delay, and a second delay element configured for realizing a second delay,
   a first scaling device between an input node of the first delay element and an output node of the second delay element, and
   a second scaling device between an output node of the first delay element and an input node of the second delay element,
   each building block moreover comprising:
   a first cross scaling device connected between the output node of the first delay element and the output node of the second delay element,
   and/or a second cross scaling device between the input node of the first delay element and the input node of the second delay element wherein each building block is configured such that, in operation, incoming signals at the input node of the second delay element are summed together and incoming signals at the output node of the second delay element are summed together,
   wherein the building blocks are cascaded with a first building block as earliest building block,
   wherein the output of the first delay element of an earlier building block is connected with the input of the first delay element of a following building block, and
   wherein the output of the second delay element of the following building block is connected with the input of the second delay element of the earlier building block such that an output signal of the second delay element of a following building block is an incoming signal of the second delay element of an earlier building block,
   such that when an incoming signal is applied to the input of the first delay element of the first building block the filtered output signal is obtained at the output of the second delay element of the first building block.

2. The filter according to claim 1, wherein the first delay element and/or the first scaling device and/or the second scaling device and/or the first cross scaling device and/or the second cross scaling device of one or more of the building blocks are non-linear.

3. The filter according to claim 1, wherein the first delay element of one or more of the building blocks is implemented using one or more latches.

4. The filter according to claim 1, wherein at least one of the first scaling device, the second scaling device, the first cross scaling device, and the second cross scaling device of one or more of the building blocks have an amplification which is adjustable.

5. The filter according to claim 1, wherein one or more of the building blocks comprises the first cross scaling device and the second cross scaling device,
   wherein the first delay of the first delay element is the double of the second delay of the second delay element or wherein the second delay of the second delay element is the double of the first delay of the first delay element.

6. The filter according to claim 1, wherein one or more of the building blocks comprises the first cross scaling device or the second cross scaling device,
   wherein the first delay of the first delay element is equal to the second delay of the second delay element.

7. The filter according to claim 1 wherein the first delay and/or the second delay of one or more of the building blocks are adjustable.

8. The filter according to claim 1 wherein the second scaling device of the earlier building block and the first scaling device of the following building block is one scaling device which is shared between the earlier building block and the following building block.

9. The filter according to claim 1 wherein a ratio between the first delay of the first delay element and the second delay of the second delay element is the same for all building blocks.

10. A multilevel signal generator comprising a predefined number of filters according to claim 1 which have the same number of building blocks and which are connected in parallel,
    wherein a first filter is connected in parallel with a second filter when
    the input of the second delay element of a building block of the cascaded building blocks of the first filter is connected with the input of the second delay element of the sequentially corresponding building block of the cascaded building blocks of the second filter and when
    the output of the second delay element of a building block of the cascaded building blocks of the first filter is connected with the output of the second delay element of the sequentially corresponding building block of the cascaded building blocks of the second filter,
    such that when an incoming signal is applied to the input of the first delay element of the first building block of the first filter, and when an incoming signal is applied to the input of the first delay element of the first building block of the second filter, the filtered output signal is obtained at the output of the second delay element of the first building block of the first and the second filter.

11. The multilevel signal generator according to claim 10 wherein the second delay element of sequentially corresponding building blocks of parallel filters is a single delay element which is shared between the filters.

12. The multilevel signal generator according to claim 10 wherein the predefined number of filters is 2.

13. A complex multilevel signal generator, comprising two multilevel signal generators according to claim 10, each multilevel signal generator comprising the same even number of filters,
    wherein pairs of filters are formed by connecting the first delay elements of corresponding filters of the two multilevel signal generators in parallel.

* * * * *